(12) United States Patent
Kiaei et al.

(10) Patent No.: US 6,856,004 B2
(45) Date of Patent: Feb. 15, 2005

(54) COMPACT LAYOUT FOR A SEMICONDUCTOR DEVICE

(75) Inventors: Ali Kiaei, Mountain View, CA (US); Mehdi Frederick Soltan, Santa Clara, CA (US); Ali Rajaei, Santa Clara, CA (US); Hamid Reza Rategh, Cupertino, CA (US)

(73) Assignee: Anadigics, Inc., Warren, NJ (US)

( * ) Notice: Subject to any disclaimer, the term of this patent is extended or adjusted under 35 U.S.C. 154(b) by 0 days.

(21) Appl. No.: 10/327,512

(22) Filed: Dec. 19, 2002

(65) Prior Publication Data

US 2003/0214016 A1 Nov. 20, 2003

Related U.S. Application Data

(63) Continuation-in-part of application No. 09/903,303, filed on Jul. 10, 2001, now abandoned.

(51) Int. Cl.$^7$ .................. H01L 27/082; H01L 27/102
(52) U.S. Cl. .................. 257/587; 257/565; 257/621
(58) Field of Search ............................ 257/565, 587, 257/621

(56) References Cited

U.S. PATENT DOCUMENTS

| | | | | | |
|---|---|---|---|---|---|
| 3,210,621 | A | * | 10/1965 | Strull | 257/166 |
| 4,250,518 | A | * | 2/1981 | Bloodworth et al. | 257/423 |
| 5,572,063 | A | * | 11/1996 | Iranmanesh | 257/565 |
| 6,633,075 | B1 | * | 10/2003 | Shirakawa | 257/565 |

* cited by examiner

Primary Examiner—Allan R. Wilson
(74) Attorney, Agent, or Firm—H. Black P.E.

(57) ABSTRACT

A semiconductor device includes a semiconductor substrate, an electrode disposed on an upper surface of the substrate, and a set of one or more transistor element(s) disposed on the upper surface of the substrate. The set of transistor element(s) compactly surrounds the electrode with a threshold distance. In one embodiment, the set also compactly surrounds a via hole. In another, the element(s) comprises a bipolar junction transistor that has an aggregate emitter length of not less than 10 microns. In still another embodiment, the device is coupled to a RF circuit for power amplification.

9 Claims, 18 Drawing Sheets

COMPACT LAYOUT FOR A SEMICONDUCTOR DEVICE

CROSS REFERENCE TO RELATED APPLICATION

This application is a continuation-in-part of U.S. patent application Ser. No. 09/903,303, filed Jul. 10, 2001, now abandoned.

BACKGROUND OF THE INVENTION

1. Field of Invention

The present invention relates to semiconductor devices and more particularly to a compact layout for a semiconductor device.

2. Description of Related Art

Typically in the design of a power amplifier, a number of transistor elements are arranged in rows and columns and then connected to provide a large equivalent power device. For example, FIG. 11 shows a conventional layout design for a semiconductor device 132 where a number of BJTs (Bipolar Junction Transistors) 134 are arranged in rows on the upper surface of a semiconductor substrate. Each BJT 134 includes an emitter contact 136, a base contact 138, and a collector contact 140. The emitter contacts 136 are connected by metal 142 to an electrode 144 that lies between the rows of BJTs 134, and the electrode 144 lies above vias 146 that provide an electrical connection to ground. The use of vias for electrical connections is well known in the art of semiconductor devices. ("Semiconductor Device Including Via Hole and Isolating Circumferential Member", U.S. Pat. No. 5,917,209.)

FIG. 12 shows a cross section of the semiconductor substrate through one of the vias 146. The via 146 is defined by a via inner wall 148 in the substrate 150. The upper surface electrode 144 is electrically connected to a lower surface electrode 152 by means of the via inner wall 148, and the lower surface electrode 152 is electrically connected to a ground plane 154. Then each BJT emitter is electrically connected to the ground plane 154.

For the design shown in FIG. 11 to function as a single power amplifier, the bases and the collectors are electrically connected. FIGS. 13A, 13B, and 13C illustrate three ways that these connections can be made for the emitters, bases and electrodes in an amplifier design. When all emitter contacts for example are connected to an upper electrode as shown in FIG. 11, then a via can be used to make an electrical connection to a lower electrode as shown in FIG. 12. Similarly FIG. 13A shows a via defined by a via inner 156 wall that connects an upper electrode 158 on a semiconductor substrate 160 with a lower electrode 162. Alternatively in the above example where the emitter contacts are connected to an upper electrode, a connection to a lower electrode can be made by a wire or metal layer. In FIG. 13B an upper electrode 164 on a semiconductor substrate 166 is connected to a lower electrode 168 by means of a wire 170 that is separated from the substrate 166 by an insulator 172.

In FIGS. 13A and 13B, the lower electrode can be driven by a single voltage source. In designs without electrodes, wires from a common voltage source can be connected to the connectors that are being driven together. FIG. 13C shows a tree-structure design for inputs to the collectors in a row of eight BJTs 174 on a semiconductor substrate surface 176. A wire 178 with a tree structure connects a collector feed 180 to collector contacts 182. Since the wire path-length from the collector feed 180 to each BJT 174 is the same, difficulties associated with different path-lengths may be avoided. For example, different path-lengths may lead to differences in DC drops, in inductances, and in heat conduction in the elements of the power amplifier.

However, even when differences between elements of a power amplifier are minimized, layout and device geometries may seriously affect the maximum achievable performance of the amplifier. For example, the inductance in the paths from emitters to the ground plane may substantially affect performance of an amplifier, whether these paths are uniform or not. Additionally these paths also affect the quality of heat conduction in the device. Moreover, although examples presented here employ BJTs, similar considerations apply for designs involving other transistor elements such as FETs (Field Effect Transistors).

SUMMARY OF THE INVENTION

This invention is based on the observation that a semiconductor device comprising a set of one or more transistor elements over a substrate with a via hole therein may be made more compact if the set of transistor element(s) compactly surrounds the via hole. Preferably, the set of transistor element(s) also compactly surrounds an electrode to which the element(s) is electrically connected through at least one contact. In this manner, no extensive electrical interconnections need to be made between the via hole and the set of element(s), or between the electrode and the element(s). Compactly surrounding the electrode or the via hole means that the set surrounds the electrode or the via hole at an angle of at least 180 degrees.

Another aspect of the invention is based on the recognition that where a set of one or more transistor element(s) compactly surrounds an electrode to which the set is electrically connected, and where at least one of the element(s) is a bipolar junction transistor with a total emitter area not less than about 400 square microns, or an aggregate emitter length not less than about 10 microns, or both, the resulting semiconductor structure is able to amplify power with improved high performance.

Yet another aspect of the invention is based on the recognition that a high performance power amplifier semiconductor device may be constructed by means of a set of one more transistor element(s) that compactly surrounds an electrode to which the set is electrically connected, together with a radio frequency circuit element electrically connected to at least one of the element(s).

Still another aspect of the invention is based on the recognition that high performance RF power amplification may be achieved by providing a semiconductor device comprising a set of one more transistor element(s) that compactly surrounds an electrode to which the set is electrically connected, and supplying a RF signal to the device, so that the device provides an amplified RF output signal.

The above aspects of the invention, taken either alone or in combination, provides one or more of the following advantages: compact use of space over the surface of the semiconductor substrate, reduced inductance, reduced DC voltage drop and improved heat conduction and heat dissipation properties.

In one embodiment of the invention, the set of transistor element(s) is within a threshold distance of not more than 300 microns from a reference point, such as the center of the electrode to which the set is electrically connected. In another embodiment, the set of one or more transistor element(s) comprises one transistor that continuously surrounds the electrode and comprises a plurality of contacts that are electrically connected to the electrode. In yet another embodiment, the set comprises a plurality of transistor element(s) surrounding the electrode.

BRIEF DESCRIPTION OF THE DRAWINGS

These advantages of the invention will become more apparent and more readily appreciated from the following detailed description of the presently preferred exemplary embodiments of the invention taken in conjunction with the accompanying drawings, where.

For simplicity in description, identical components are labeled by the same numerals in this application.

DETAILED DESCRIPTION OF EXEMPLARY EMBODIMENTS

Figure 1:
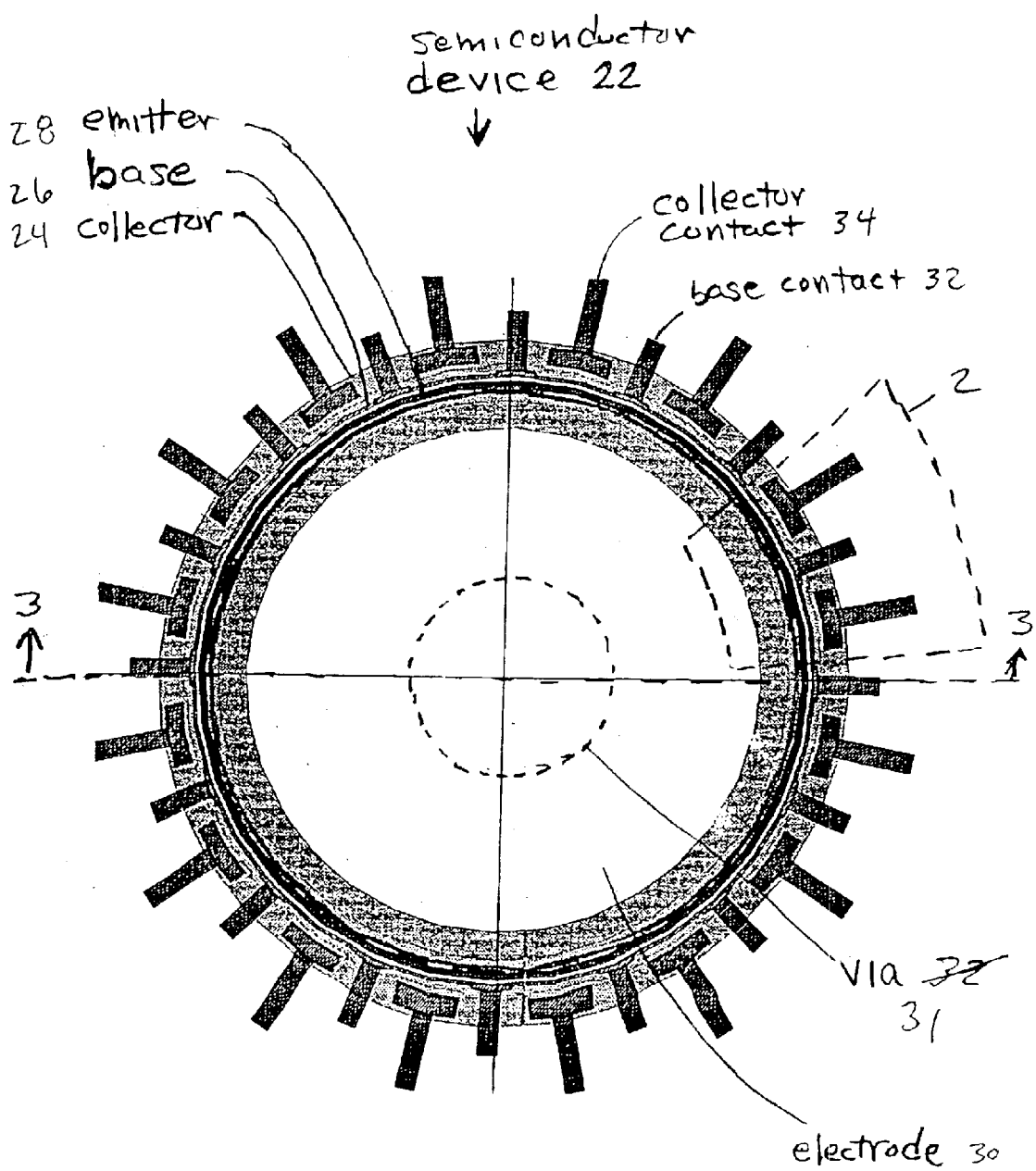
FIG. 1 is a top view of an embodiment of the present invention.
Figure 2:
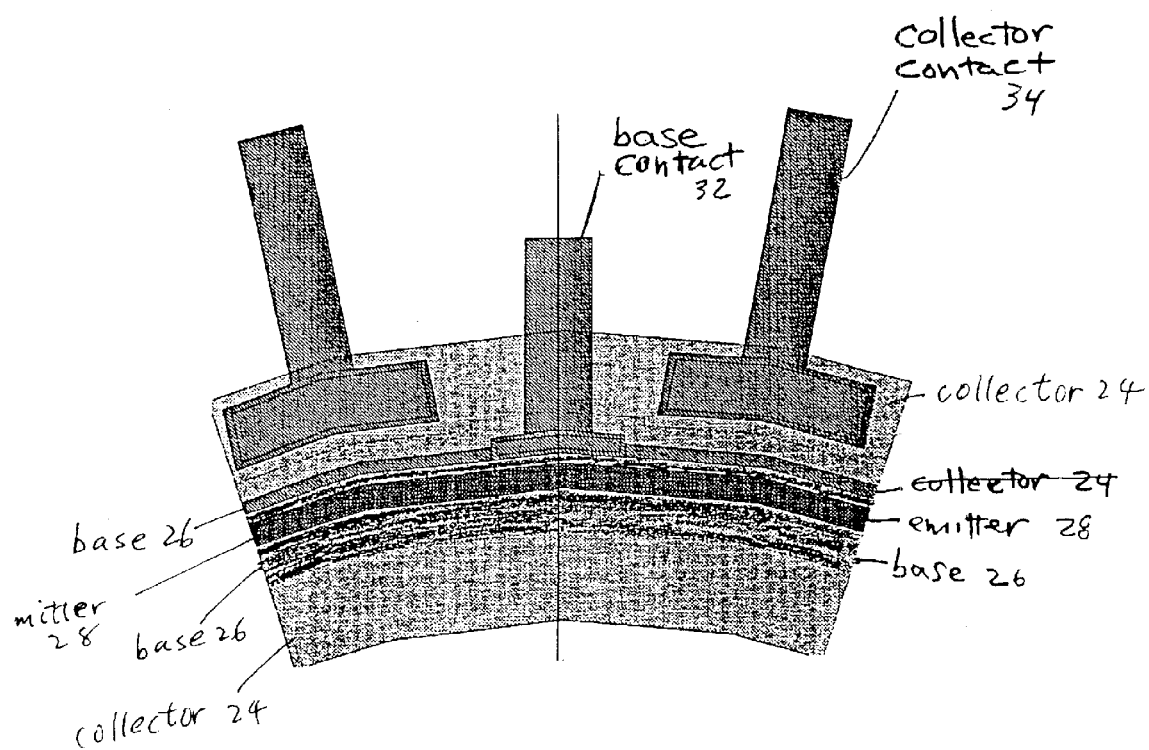
FIG. 2 is a segmented view associated with the embodiment shown in FIG. 1.

A preferred embodiment of the present invention is shown in FIG. 1. FIG. 1 shows a top view of a GaAs semiconductor device 22 with a circular layout. While device 22 may be constructed using GaAs, it will be understood that it may also be constructed using other types of semiconductor material such as silicon. On a substrate upper surface, a continuous transistor element surrounds a circular layout and includes transistor layers for a collector 24, a base 26 and an emitter 28. An electrode 30 lies above a via 31 in the substrate. A section of the device is shown in FIG. 2. Base contacts 32 connect to the base 26, and collector contacts 34 connect to the collector 24. Although not shown in FIGS. 1 and 2, a metal connection joins the emitter 28 and the electrode 30.

Figure 3:
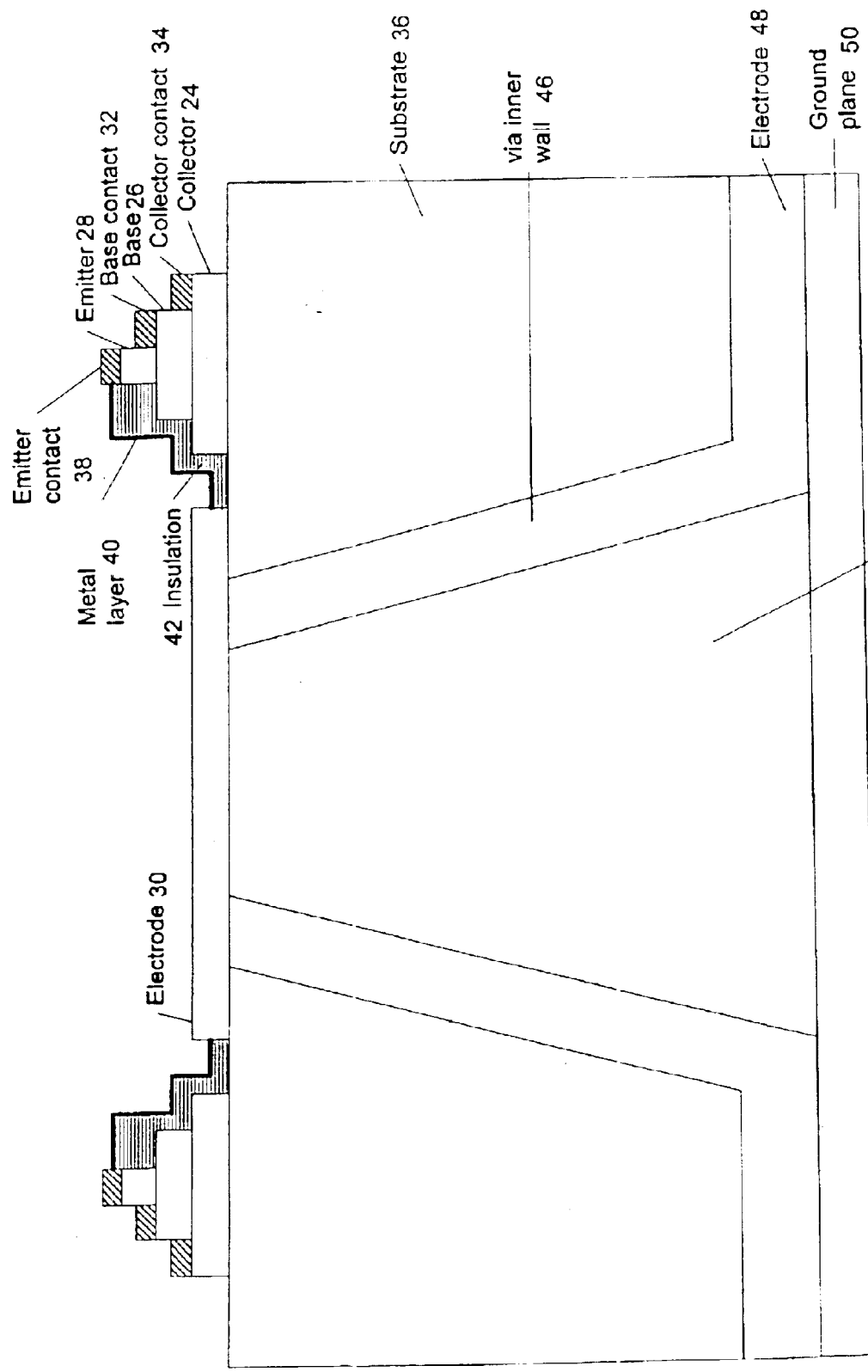
FIG. 3 is a cross-sectional view associated with the embodiment shown in FIG. 1.

FIG. 3 shows a cross-sectional view of the device. The collector 24 is disposed on the upper surface of the substrate 36 in the shape of a mesa. Similarly the base 26 is disposed in the shape of a mesa on top of the collector 24, and the emitter 28 is disposed in the shape of a mesa on top of the base 26. In addition to the collector contacts 34 and the base contacts 32, FIG. 3 shows emitter contacts 38 that are connected by a metal layer 40 to the electrode 30. An insulation layer 42 separates this metal layer 40 from the base 26 and the collector 24. A via 44 is defined by a via inner wall 46 in the substrate 36. The via inner wall 46 makes an electrical connection between the upper electrode 30 and a lower electrode 48, which is in contact with a ground plane 50, thereby completing an electrical connection between the emitter mesa 28 and the ground plane 50.

The circular device advantageously places transistor layers (i.e., emitter 28, base 26, and collector 24) about a circular upper electrode 30 that connects to the ground plane 50 by means of the via 44. This design is desirably symmetric and desirably allows full use of the substrate surface near the upper electrode 30, thereby enabling a compact arrangement of transistor elements for a power amplifier.

By minimizing the path-length from the emitter to ground, the corresponding inductance is minimized as well as the DC drop, thereby allowing higher gains and efficiencies. Furthermore, the proximity of the active devices (i.e., the transistor layers) to the upper electrode 30 and to the via 44, desirably enables improved heat dissipation. Due to better and more balanced heat conduction, problems related to local hot nodes in the device 22 can be minimized, thereby increasing the reliability of the device 22 and also reducing the chances of local thermal runaway associated with bipolar devices.

Thus, the present invention enables a compact arrangement of transistor layers with reduced DC drop, reduced electrical inductance and improved heat conductance as compared with conventional devices. As a result, power density to a die is desirably increased so that more power can be achieved for a given die area. Although the discussion here has focused on the emitter contacts, the symmetry of the device may also be exploited for making electrical connections to the base contacts and the collector contacts as discussed below. As the term is used here, an electrode may be any conducting surface (e.g., a metallic surface) including a pad, a metallic plane, or a ground plane.

Figure 14A:
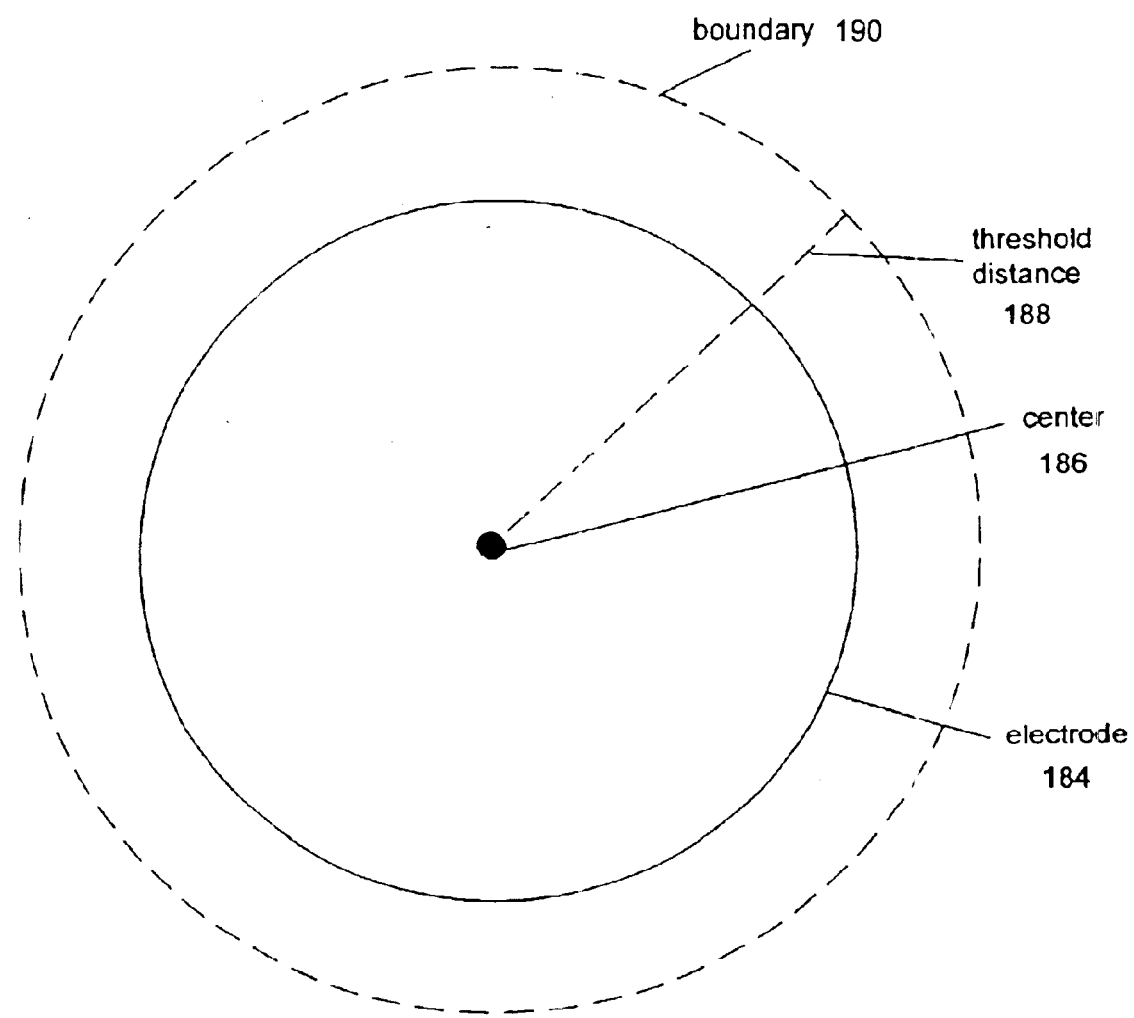
FIGS. 14A and 14B illustrate a continuous transistor element that "compactly surrounds" an electrode.
Figure 14B:
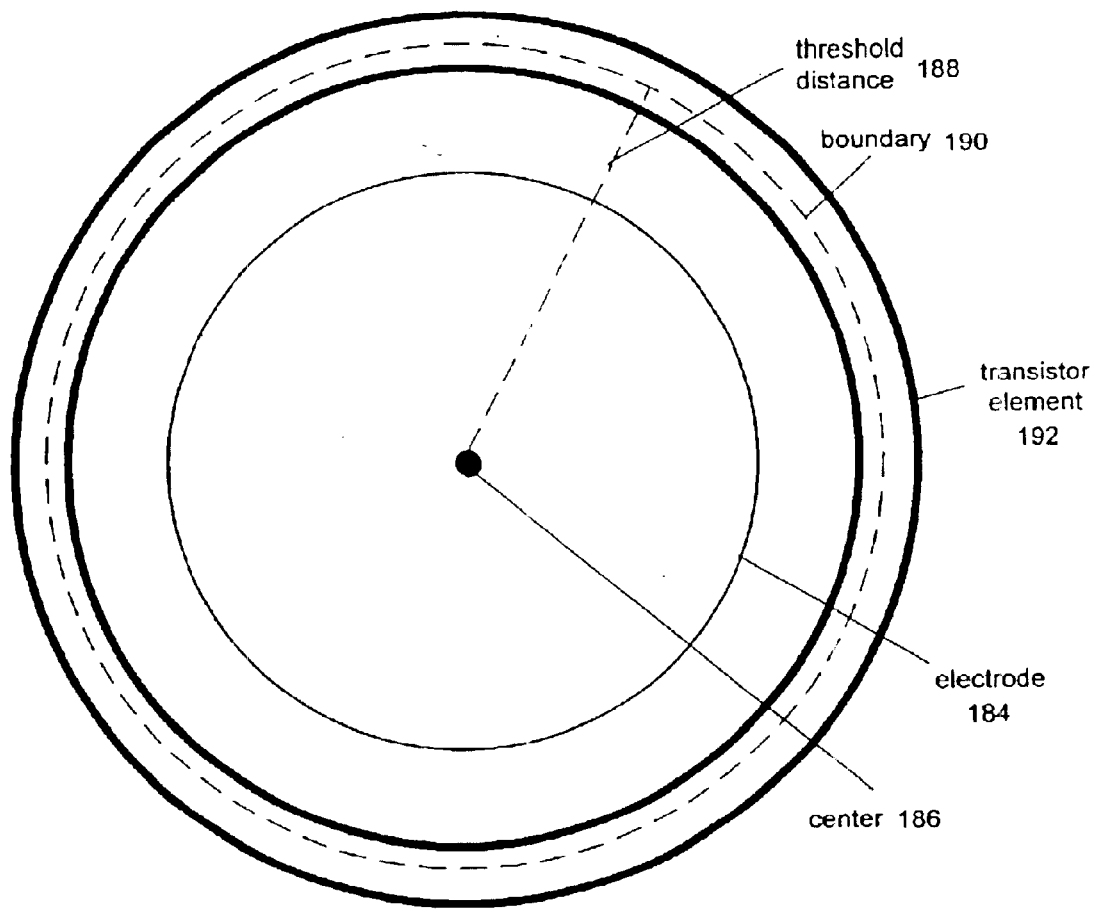

FIGS. 14A and 14B illustrate the compact arrangement of a continuous transistor element as in the embodiment of FIG. 1. In FIG. 14A, an electrode 184 has a center 186 from which a radial threshold distance 188 is measured to determine a boundary 190. This boundary 190 characterizes the radial distance within which a portion of the transistor element (e.g., a portion of the emitter contacts) preferably lies for a compact layout as illustrated in FIG. 1. In FIG. 14B a circular transistor element 192 has been added to represent the emitter, base and electrode layers in FIG. 1. The transistor element 192 compactly surrounds the electrode since each radial line from the center to the boundary intersects the transistor element 192. In general, the threshold distance 188 is chosen so that the path-lengths from transistor connectors to center 186 of the electrode 184 is minimized or substantially limited. For example, in a specifically preferred embodiment, a threshold distance 188 of 300 microns may be used.

As a variation from the definition of the threshold distance above, the center 186 may be any reference point rather than the geometric center of the electrode 184. For example, in the case where the electrode 184 lies above or below a via, the center of the via may be used. Such and other variations are within the scope of the invention.

Figure 4:
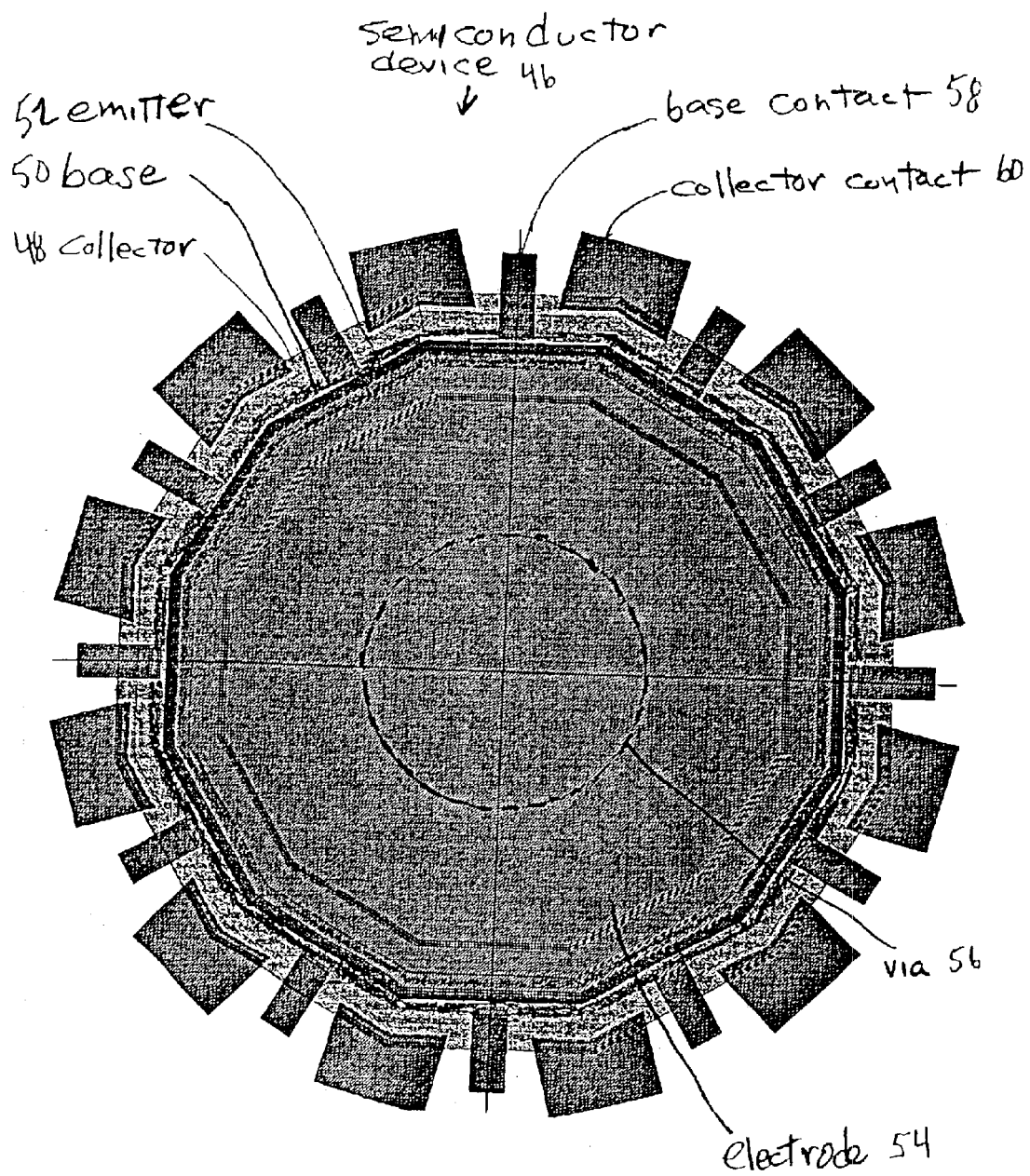
FIG. 4 is a top view of another embodiment of the present invention.

In some contexts, a layout with linear edges and corners may be preferable, for example, because of constraints in the fabrication process. FIG. 4 shows a top view of a semiconductor device 46 with a polygonal layout on a substrate upper surface. As in the circular device, semiconductor layers for a collector 48, a base 50 and an emitter 52 surround a polygonal electrode 54 on a substrate upper surface, and an electrode 54 lies above a via 56 in the substrate. FIG. 4 also shows base contacts 58 connected to the base 50, and collector contacts 60 connected to the collector 48.

In some operational settings, it is not possible to employ a device that continuously surrounds and fully encloses a via. For example, circular mesa-like (or donut-like) transistor elements as in the device shown in FIGS. 1–3 may not be possible because of constraints in the fabrication process. In this case, a continuous transistor element may be replaced by a set of discrete transistor elements.

Figure 5:
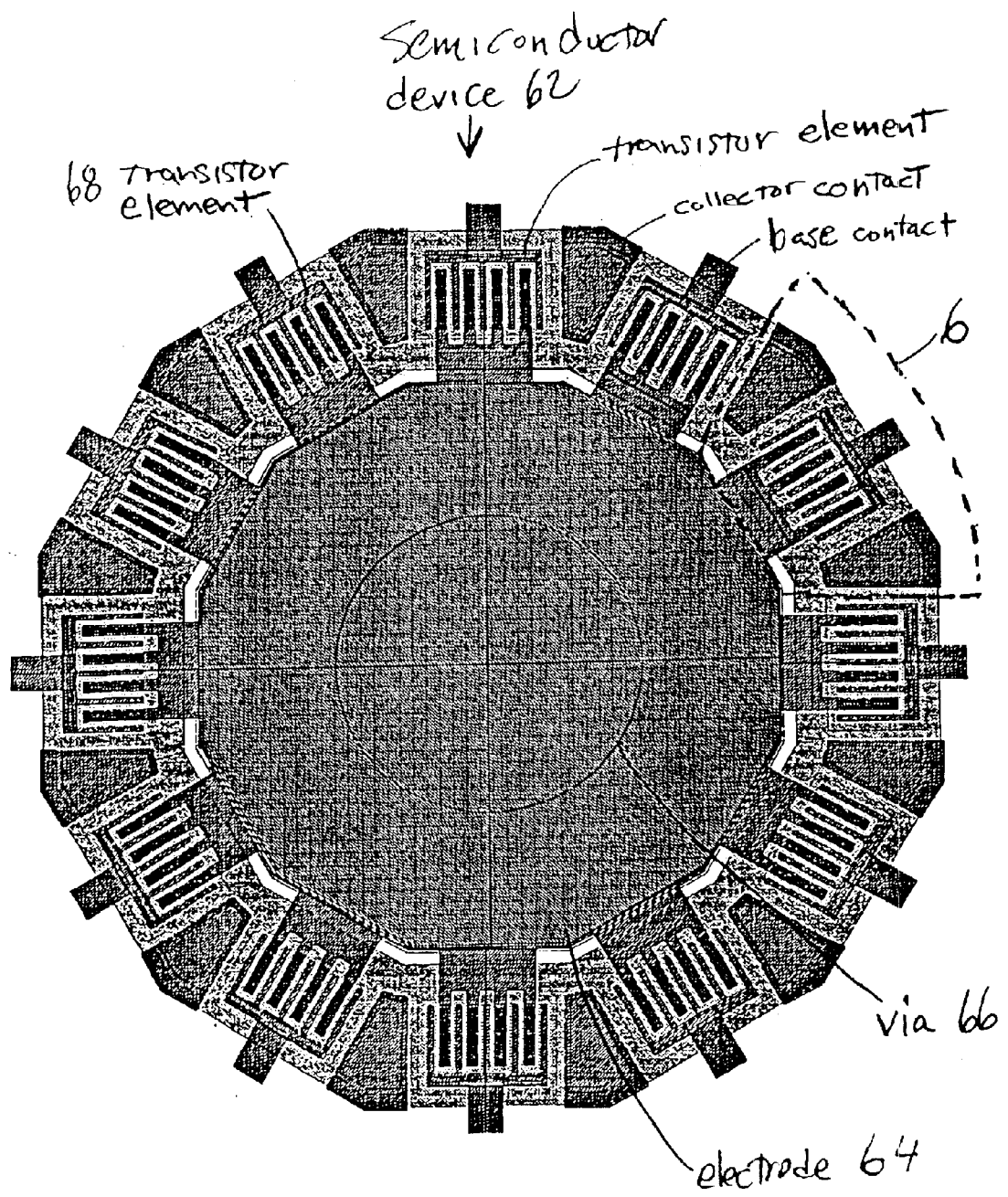
FIG. 5 is a top view of another embodiment of the present invention.
Figure 6:
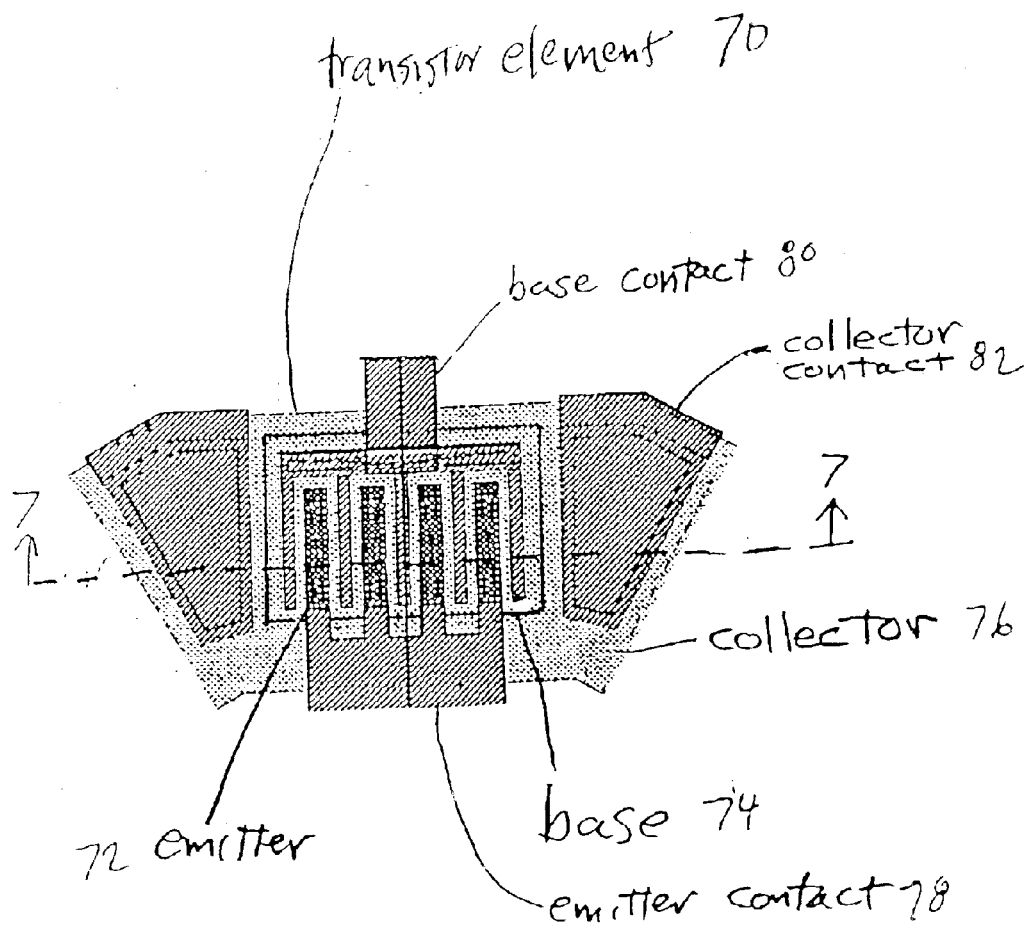
FIG. 6 is a top view of an element from the embodiment shown in FIG. 5.
Figure 7:
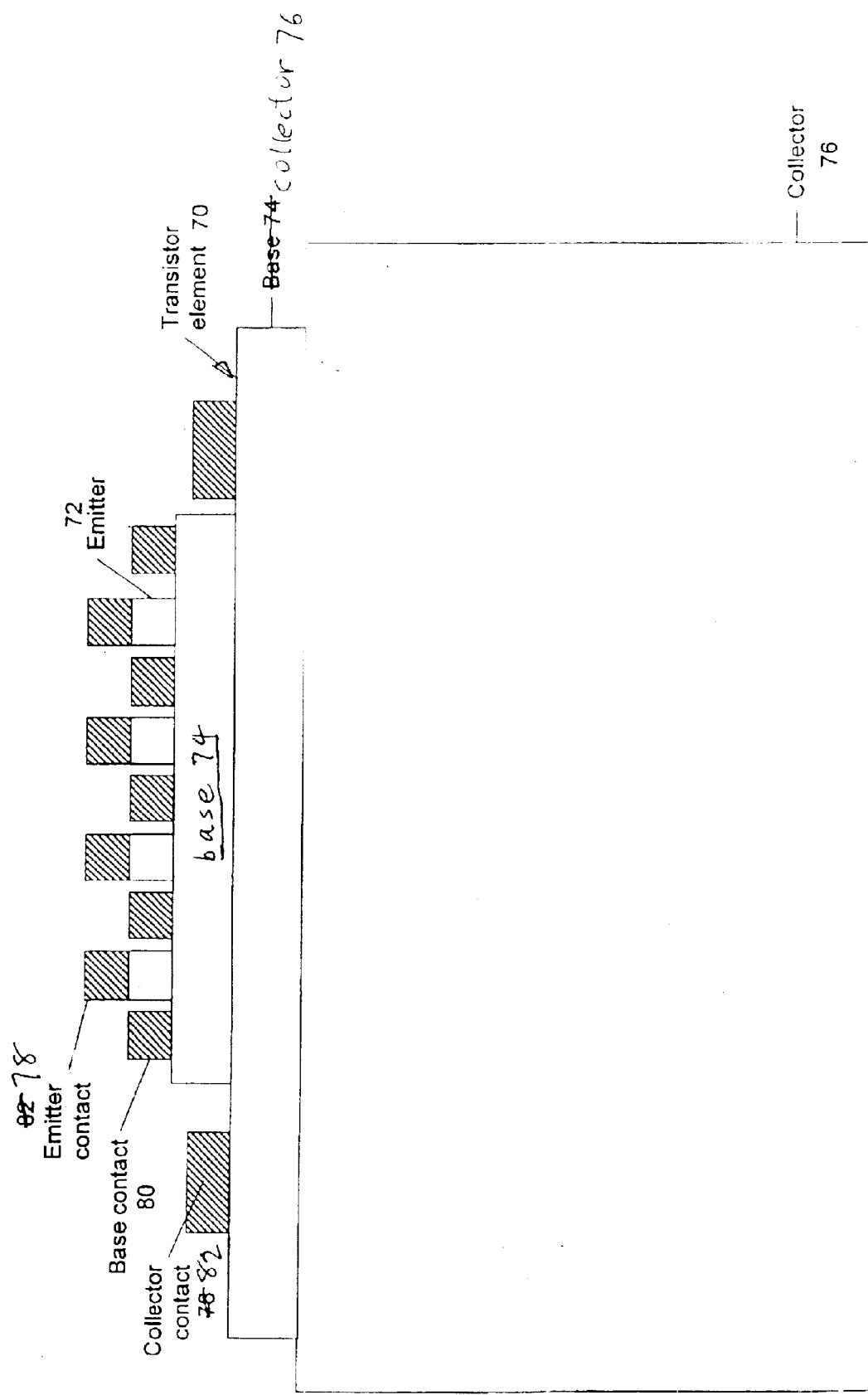
FIG. 7 is a cross-sectional view along the line 7—7 in FIG. 6 associated with the embodiment shown in FIG. 6.

FIG. 5 shows a top view of a preferred embodiment of semiconductor device 62 with a polygonal layout on a substrate upper surface. A polygonal electrode 64 lies above a via 66 in the substrate, and transistor elements 68 are arranged about the electrode 64. A detail of a transistor element 70 is shown in FIG. 6 with a cross-sectional view shown in FIG. 7. In FIGS. 6 and 7 the transistor element 70 includes an emitter 72, a base 74, and a collector 76 together with an emitter contact 78, a base contact 80, and a collector contact 82. As illustrated in these figures, the base contact 80 is interdigitated with the emitter mesa 72.

Figure 15A:
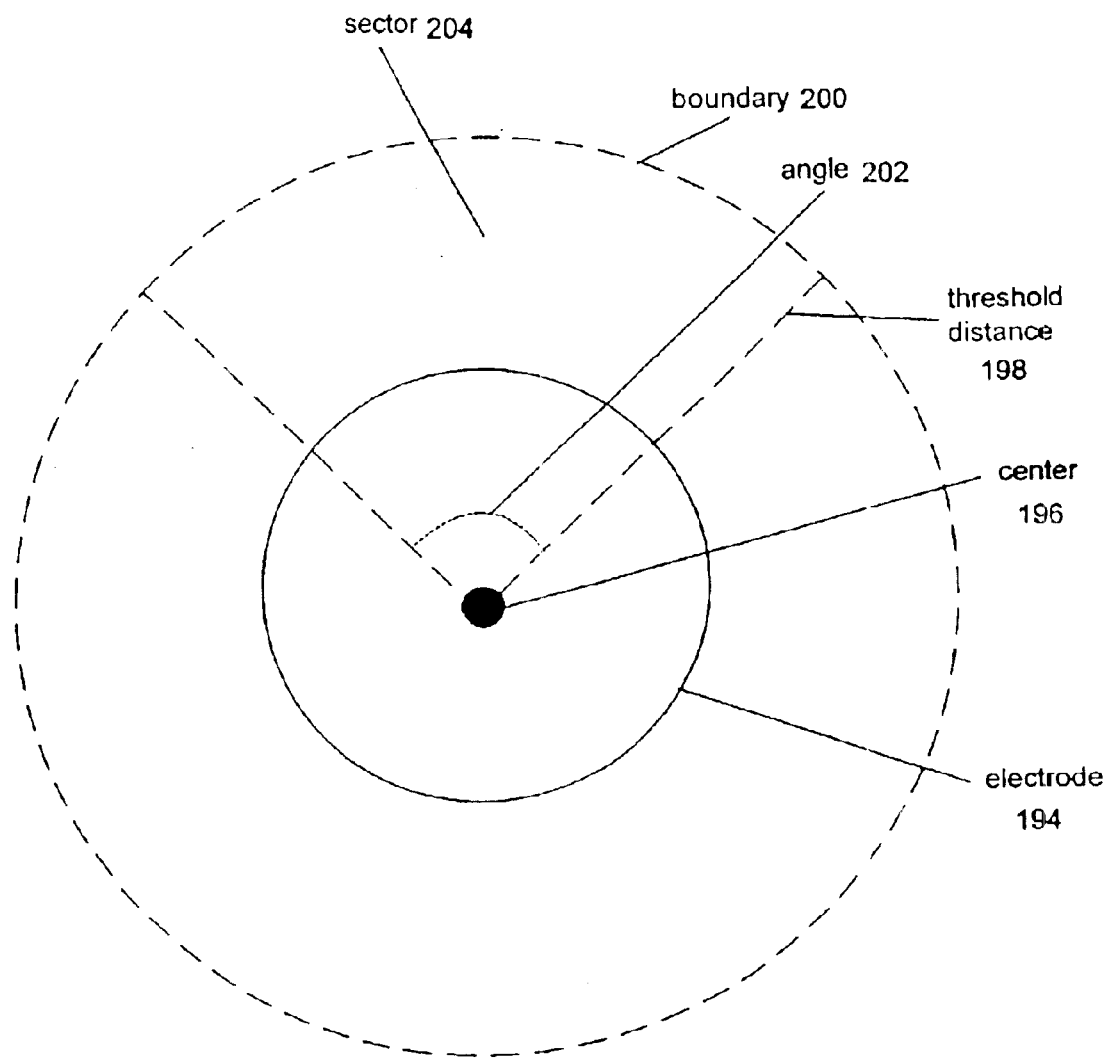
FIGS. 15A and 15B illustrate a set of discrete transistor elements, where the set "compactly surrounds" an electrode.
Figure 15B:
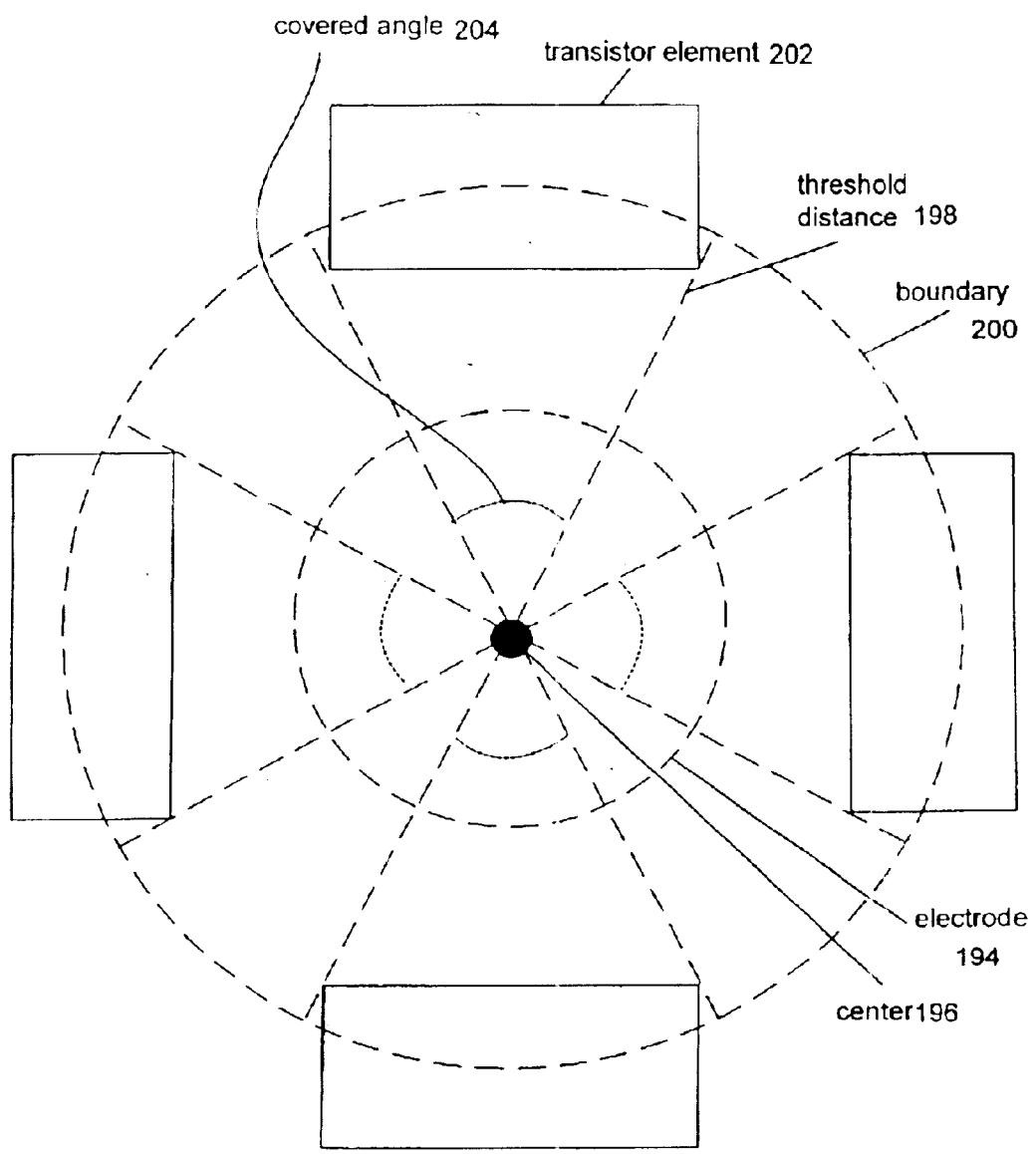

FIGS. 15A–15B illustrate an extension of the above definition for "compactly surrounds" for the case where discrete transistor elements are used as compared with the continuous transistor elements for emitter base and collector in the embodiment shown in FIGS. 1–3. In FIG. 15A an electrode 194 has a center 196 from which a radial threshold distance 198 (e.g., 300 microns) is measured to determine a boundary 200. As in FIG. 14A, this boundary characterizes the radial distance within which a transistor element preferably lies for a compact layout. However, for the case of a discrete transistor element, only an angular portion of the center may be "compactly surrounded" as described above for a single element. As illustrated in FIG. 15A, a transistor element compactly covers an angle 202 provided each radial line from the center 196 to the boundary 200 within the corresponding sector 204 intersects the transistor element. Then the definition of "compactly surrounds" may be extended as follows for a set of transistor elements where the set includes at least one transistor element. A set of transistor elements compactly surrounds a reference point related to an electrode when the sum of the covered angles at the reference point corresponding to the elements is at least a threshold angular value. For example, FIG. 15B shows four elements 202 with four corresponding covered angles 204. These elements 202 compactly surround the center 196 of electrode 194 provided the sum of these angles 204 is greater than some threshold angular value. For example, in a specifically preferred embodiment, a threshold angular value of 180 degrees may be used.

Where the electrode 184 and/or 194 lies above or below a via such as 44, 56, 66, 88 or 104, the set of one or more transistor element(s) also compactly surrounds a reference point (e.g. the center of via hole) related to the via hole (i.e. sum of angles subtended by the set less than a threshold angular value, as in the case of electrode 194). Preferably the set of one or more transistor element(s) may lie within a threshold distance (e.g. 300 microns) from the reference point of the hole. In other words, similarly as in the definition based on FIGS. 14A–14B, the center 196 may be any reference point (e.g., the center of a via) rather than the geometric center of the electrode 194.

Figure 8:
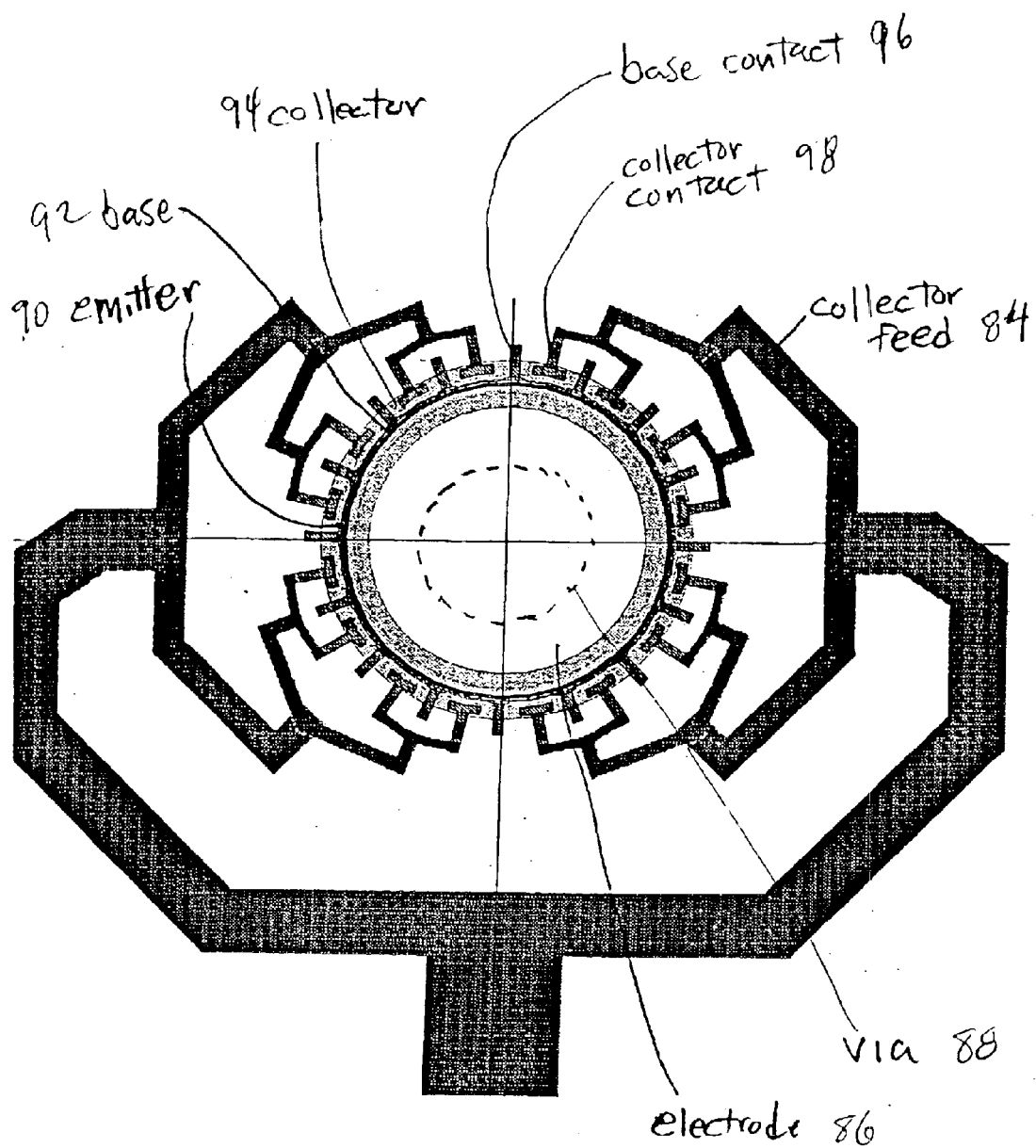
FIG. 8 is a top view of another embodiment of the present invention related to embodiment shown in FIG. 1.

The present invention enables the efficient operation of devices discussed above by designs that exploit the geometry of the layout. For example, for the device shown in FIGS. 1–3, the emitter is electrically connected to the ground plane by means of the via. FIG. 8 shows an embodiment of a collector feed 84 with a tree structure that exploits the symmetry of the design. Similarly as in the device 22 shown in FIGS. 1–3, the embodiment of FIG. 8 includes a circular electrode 86 above a via 88. A circular transistor element includes an emitter 90, a base 92, and a collector 94. FIG. 8 also shows bases contacts 96 and collector contacts 98, which are connected to the collector feed 84. Since the emitter contacts (not shown) and the base contacts 96 are at different vertical levels as shown in FIG. 3, a base feed that has a similar tree structure may be added to the design to complete the electrical connections for the emitter 90, base 92 and collector 94.

The design shown in FIG. 8 desirably balances the delays and losses (e.g., DC drops) in the signal paths in order to minimize the uncorrelated or multi-amplitude summation of the RF signals of the base and collector since these effects can cause gain and efficiency loss. The layout shown in FIG. 8 illustrates a circular distribution network that desirably balances those delays and losses in the collector signal.

Figure 9:
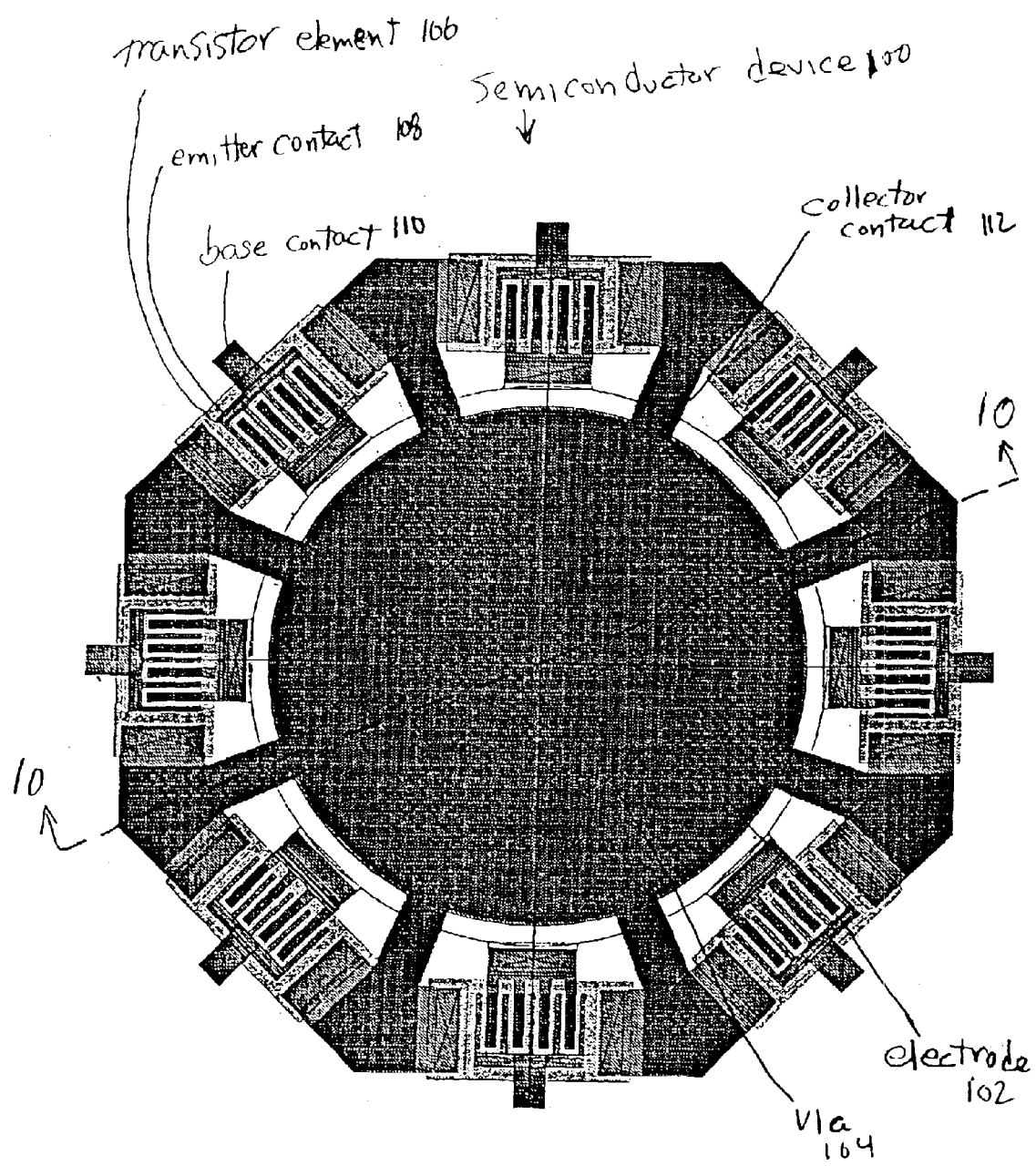
FIG. 9 is a top view of another embodiment of the present invention.
Figure 10:
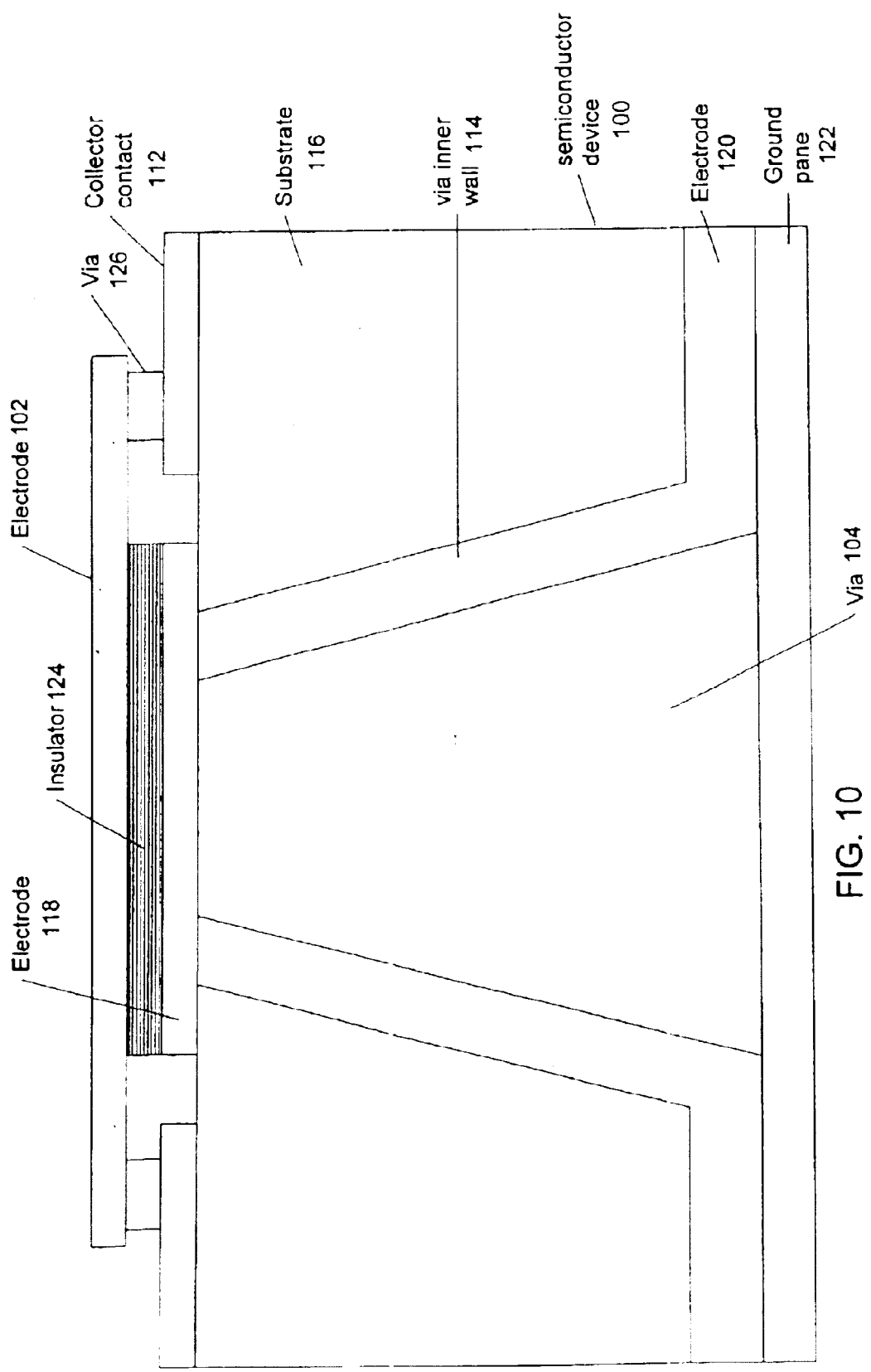
FIG. 10 is a cross-sectional view associated with the embodiment shown in FIG. 9.
Figure 11:
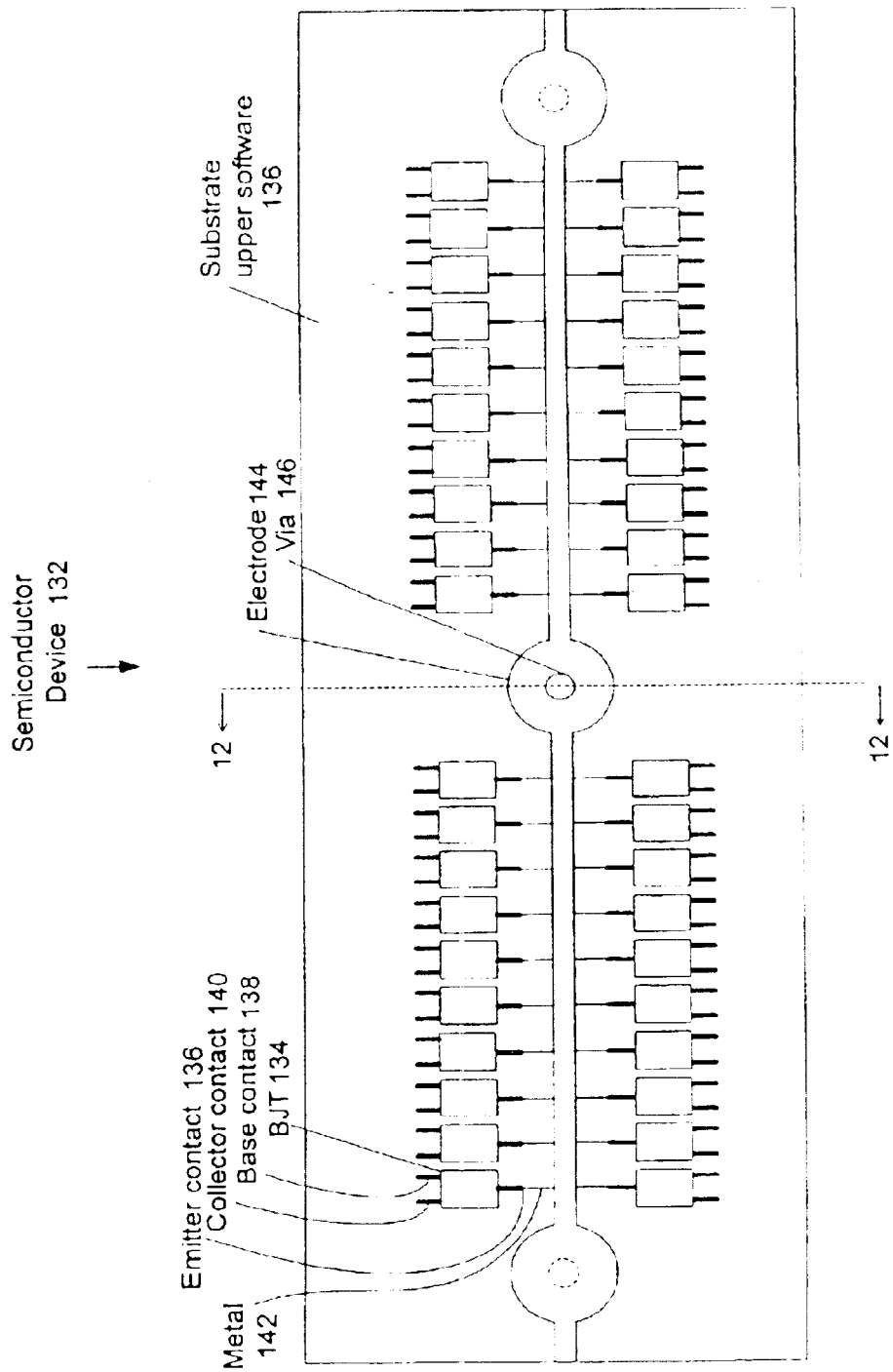
FIG. 11 is a conventional layout design for a semiconductor device.
Figure 12:
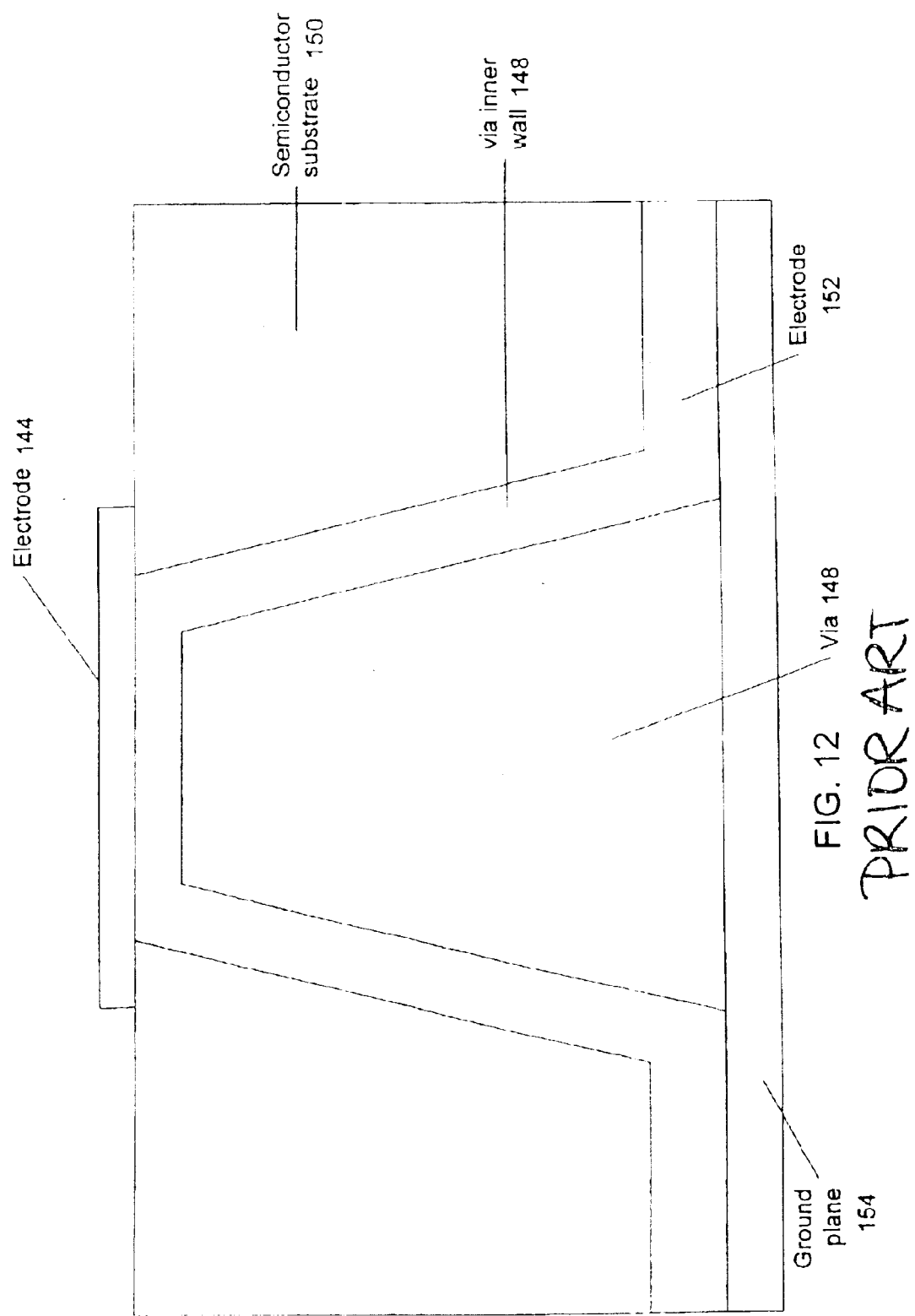
FIG. 12 is a cross-sectional view associated with the device shown in FIG. 11.

Alternatively, an additional electrode may be added to the upper surface of the substrate in order to complete the electrical connections. For example, FIG. 9 shows an embodiment that is similar to the embodiment shown in FIG. 5. FIG. 9 shows a top view of a semiconductor device 100 with a polygonal layout on a substrate upper surface. A polygonal electrode 102 lies above a via 104 in the substrate, and transistor elements 106 are arranged about the electrode 102. FIG. 9 shows emitter contacts 108, base contacts 110 and collector contacts 112. A cross-sectional view of the device 100 is shown in FIG. 10. Similarly as in FIG. 3, the via 104, defined by a via inner wall 114 in the substrate 116, makes an electrical connection from a first upper electrode 118 on the surface of the substrate 116 to a lower electrode 120 that is connected to a ground plane 122. Although not shown in FIGS. 9–10, the first upper electrode 118 is connected to the emitters as in the device shown in FIGS. 1–3.

Figure 13A:
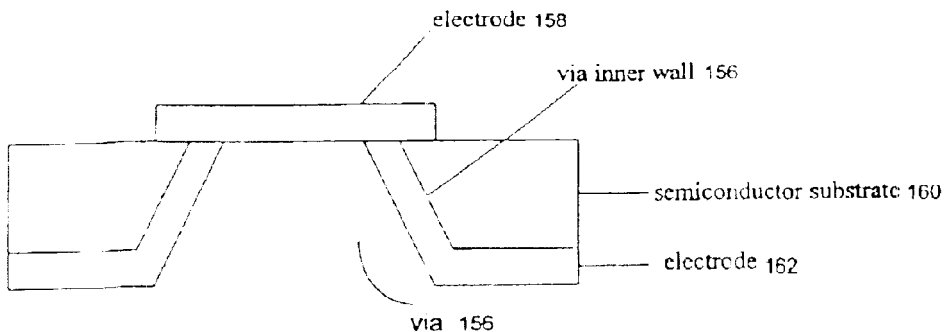
FIGS. 13A, 13B and 13C are views that show conventional electrical contacts for semiconductor devices.
Figure 13B:
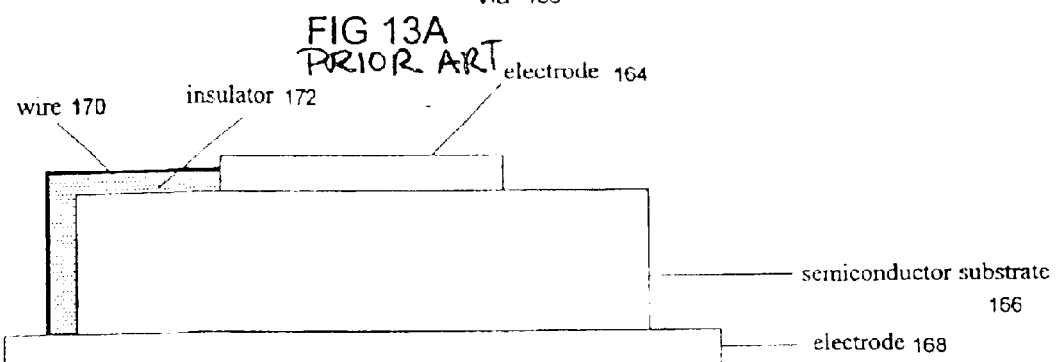
Figure 13C:
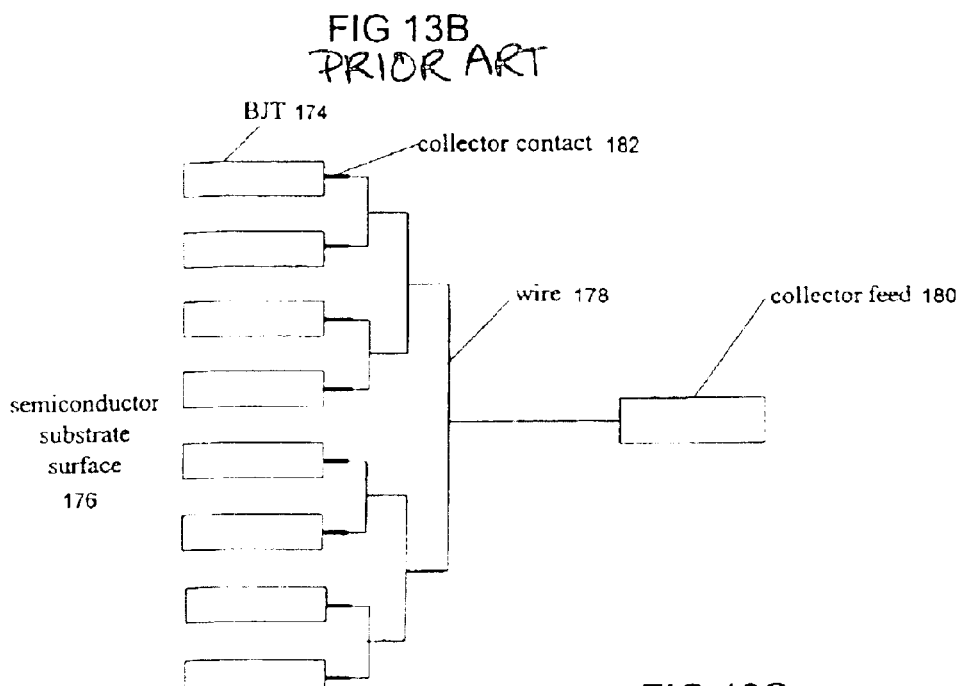

A second upper electrode 102 (i.e., as shown in FIG. 9) is separated from the first upper electrode 118 insulator 124, and a via 126 makes an electrical connection between the collector contacts 112 and the second upper electrode 102. Then, analogously to the connection illustrated in FIG. 13B, a wire connection (not shown) can be used to connect the second upper electrode 102 to a collector feed. The embodiment shown in FIGS. 9–10 desirably utilizes the same space on the surface of the substrate for the collector electrode and the emitter electrode while keeping these electrodes isolated electrically. As shown in FIG. 10, the second upper electrode 102 is physically and electrically isolated from the first upper electrode 118, which is grounded through the via 104. In this way the present invention effectively uses an equivalent area of one electrode for both connecting the collector contacts to a package (e.g., through wires as is FIG. 13B) and connecting the emitter contacts to a ground plane (e.g., through a via as in FIG. 13A).

Additionally, a base feed with a tree-structure geometry as shown in FIG. 8 can be added to the device to complete the electrical connections to the base connectors. As noted above, this type of feed connection may be advantageous in some application where balancing delay and loss is critical.

Figure 16:
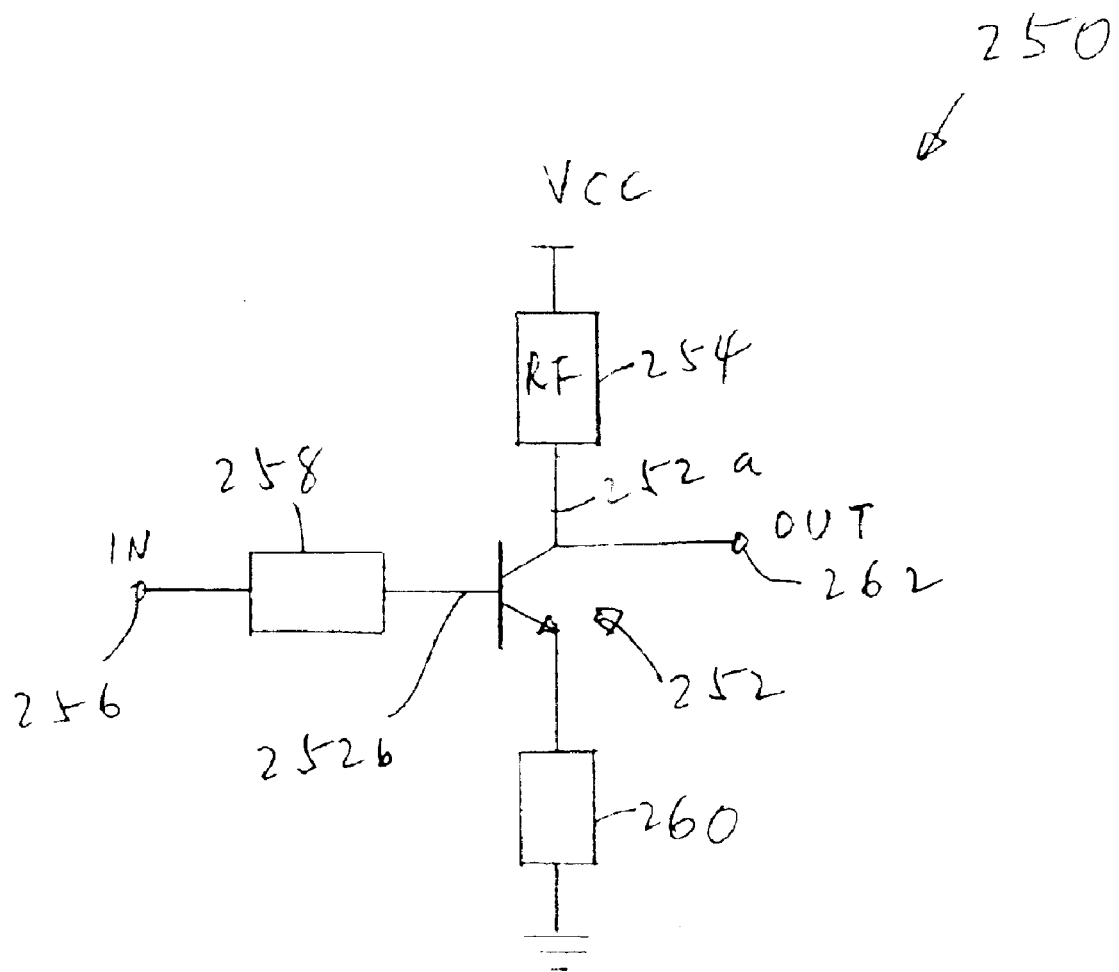
FIG. 16 is a schematic circuit diagram of a power amplifier semiconductor device to illustrate one embodiment of the invention.

FIG. 16 is a schematic circuit diagram of a power amplifier circuit to illustrate another embodiment of the invention. As shown in FIG. 16, circuit 250 includes a transistor device 252. Transistor device 252 may comprise any one of the above-described semiconductor device configurations, such as any of the embodiments of the semiconductor device described above, including semiconductor device 22, 46, 62, 70 or 100. In other words, where transistor device 250 comprises a single transistor that continuously compactly surrounds an electrode, device 250 comprises such transistor. This is the case in semiconductor devices 22 and 46. In such event, the collector contact 250a comprises collectively the collector contacts in such devices 22 and 46, and the base contact 250b comprises collectively the base contacts for devices 22 and 46. Where device 250 comprises a number of discrete transistor elements such as in devices 62, 70 and 100, the collector contact 250a comprises collectively the collector contacts of all the discrete transistors in devices 62, 70 and 100, and the base contact 250b comprises collectively the base contacts for devices 62, 70 and 100.

Power amplifiers for many applications (such as wireless and other telecommunication applications) are sometimes used to amplify signals having frequencies in the radio frequency range (e.g., 1 to 3 GHz). For such purpose, such power amplifiers may include a radio frequency ("RF") circuit. As shown in FIG. 16, an RF circuit 254 is coupled between the collector 252a contact of the transistor device 252 and the DC voltage supply VCC. The RF circuit 254 may comprise simply an inductor, such as an inductor coil, or more complex RF circuitry. The base contact 252b of transistor device 252 is connected to an input node 256 through an optional circuit 258 which may also comprise an RF circuit such as an inductor coil, or more complex RF circuitry. The emitter contact of transistor device 252 is connected to ground through another optional circuit 260 which may also comprise an RF circuit such as an inductor coil or other more complex RF circuits. The collector contact 252a is also connected to an output node 262.

An input RF signal (or a signal having a RF component) is supplied to input node 256. This signal is amplified by device 250, which supplies the amplified RF signal (or a signal having a RF component) at its output node 262. A device containing device 252 but without RF circuit 254, and with or without circuits 258 and 260, may also be used for RF amplification in the same manner.

To be effective as a power amplifier, the transistor device 252 preferably is a bipolar junction transistor having preferred dimensions. In one embodiment, for example, the aggregate emitter length is not less than about 10 microns. This means that where device 250 comprises a single transistor (e.g. 22 or 46), the entire emitter length of the single transistor in the device (e.g. 22 or 46) is not less than about 10 microns. Where device 250 comprises multiple discrete transistors, the sum of the lengths of the emitters in the discrete transistors in devices such as 62, 70 and 100 not less than about 10 microns. The aggregate collector length and base length of the bipolar junction transistor may be defined in a similar manner with respect to the embodiments in devices 22, 46, 62, 70 and 100. Preferably, the aggregate collector length and/or aggregate base length of the bipolar junction transistor is also not less than about 10 microns.

Alternatively, the effectiveness of power amplification can also be determined in terms of the total emitter area rather than the aggregate emitter length of a bipolar junction transistor device 252. In one embodiment, for example, the total emitter area is not less than about 400 square microns. This means that where device 250 comprises a single transistor (e.g. 22 or 46), the total emitter area of the single transistor in the device (e.g. 22 or 46) is not less than about 400 square microns. Where device 250 comprises multiple discrete transistors, the sum of the emitter areas in the discrete transistors in devices such as 62, 70 and 100 is not less than about 400 square microns. In some embodiments, bipolar junction transistor 252 can have dimensions such that the aggregate emitter length is not less than about 10 microns, and the total emitter area is not less than about 400 square microns.

From the description above, it will be evident that one or more of the embodiments above is advantageous over the prior art in one or more respects. These advantages include an efficient use of space on or over the surface of a semiconductor substrate for incorporating transistors. Inductance of the resulting device is reduced. Heat conduction and heat dissipation properties are much improved over conventional devices. The DC voltage drop across the interconnections employed in the device is also reduced.

While the invention has been described above by reference to various embodiments, it will be understood that changes and modifications may be made without departing from the scope of the invention, which is to be defined only by the appended claims and their equivalents. For example, while the electrodes 30, 54, 64, 86 are shown in some of the figures to be on the substrate, as are some of the transistor elements (e.g. collector 24, 76), this is not required, and there can be layers on the substrate separating the substrate from the electrodes and/or the transistor elements. All such variations are within the scope of the invention. All references referred to herein are incorporated by reference in their entireties.

What is claimed is:

1. A semiconductor device, comprising:
   a semiconductor substrate having a surface and defining a via hole therein through the surface;
   a first electrode over the surface of the substrate;
   a set of one or more transistor element(s) over the surface of the substrate, each transistor element in the set comprising at least one contact that is electrically connected to the first electrode, wherein the set of transistor element(s) compactly surrounds the first electrode and the via hole;
   a first and a second feed each having a respective tree-structure for balancing a respective feed signal, each transistor element having at least one contact that is electrically connected to the second feed;
   an insulating layer disposed on the first electrode;
   a third electrode disposed on the insulating layer and
   a metal connection that electrically connects a second electrode to the third electrode, each transistor element having at least one contact that is electrically connected to the second electrode.

2. The semiconductor device of claim 1 wherein
   the semiconductor substrate includes a via inner wall that defines the via hole, and the via inner wall electrically connects the first electrode with the second electrode, the second electrode being disposed on another surface of the substrate.

3. The semiconductor device of claim 1 wherein
   the set of transistor element(s) is within a distance of not more than 300 microns from a reference point related to the electrode and via hole.

4. The semiconductor device of claim 1 wherein
the set of transistor element(s) comprises at least one bipolar junction transistor, and an aggregate emitter length of the at least one bipolar junction transistor(s) in the set is not less than about 10 microns.

5. The semiconductor device of claim 4
wherein an aggregate collector length of the at least one bipolar junction transistor is not less than about 10 microns or an aggregate base length of the at least one bipolar junction transistor is not less than about 10 microns.

6. The semiconductor device of claim 1 wherein
the set of transistor element(s) comprises at least one bipolar junction transistor, and a total emitter area of the at least one bipolar junction transistor in the set is not less than about 400 square microns.

7. The semiconductor device of claim 1,
wherein the first electrode has a circular or polygonal shape.

8. The semiconductor device of claim 1
at least one of the transistor element(s) continuously surrounding the first electrode.

9. The semiconductor device as claimed in claim 1 wherein
at least one of the transistor element(s) has a circular or polygonal shape.

* * * * *